United States Patent
MacDonald et al.

(10) Patent No.: US 8,063,382 B2
(45) Date of Patent: Nov. 22, 2011

(54) OZONE-FREE IONIC WIND

(75) Inventors: Mark MacDonald, Beaverton, OR (US); Rajiv K. Mongia, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 12/641,753

(22) Filed: Dec. 18, 2009

(65) Prior Publication Data
US 2011/0149461 A1    Jun. 23, 2011

(51) Int. Cl.
*H01T 23/00* (2006.01)
*H05K 7/20* (2006.01)

(52) U.S. Cl. ............... 250/423 R; 250/424; 29/890.035; 361/690; 361/694; 361/231

(58) Field of Classification Search ............... 250/423 R, 250/423 P, 424, 432 R, 436; 361/231, 689, 361/690, 692–697, 700, 679.47, 679.48, 361/678.49, 679.5; 29/890.035
See application file for complete search history.

(56) References Cited

U.S. PATENT DOCUMENTS

| | | | | |
|---|---|---|---|---|
| 3,296,491 A * | 1/1967 | Brown | ............................ | 361/228 |
| 4,069,665 A * | 1/1978 | Bolasny | ............................ | 60/275 |
| 5,625,195 A * | 4/1997 | Grouillet | .................... | 250/492.21 |
| 5,811,820 A * | 9/1998 | Kirchner et al. | ............ | 250/432 R |
| 6,211,516 B1 * | 4/2001 | Syage et al. | ..................... | 250/288 |
| 6,326,615 B1 * | 12/2001 | Syage et al. | ..................... | 250/287 |
| 6,335,787 B1 * | 1/2002 | Nishi | ............................... | 355/67 |
| 6,803,585 B2 * | 10/2004 | Glukhoy | .................... | 250/423 R |
| 6,870,598 B2 * | 3/2005 | Nishi | ............................... | 355/30 |
| 7,269,008 B2 | 9/2007 | Mongia et al. | | |
| 7,545,640 B2 | 6/2009 | Fisher et al. | | |
| 2003/0234369 A1 * | 12/2003 | Glukhoy | .................... | 250/423 R |
| 2008/0156004 A1 * | 7/2008 | MacDonald | ....................... | 62/89 |
| 2010/0172095 A1 * | 7/2010 | MacDonald et al. | .......... | 361/695 |
| 2011/0073294 A1 * | 3/2011 | MacDonald et al. | .......... | 165/185 |

OTHER PUBLICATIONS

Genuth, Iddo, "Ionic Wind—Chillin' the PC", Jan. 2, 2007, Webpage available at: http://thefutureofthings.com/articles/46/ionic-wind-chillin-the-pc.html.

* cited by examiner

*Primary Examiner* — Bernard E Souw
(74) *Attorney, Agent, or Firm* — B. Delano Jordan; Jordan IP Law, PC

(57) ABSTRACT

In one embodiment, an air mover may include a first electrode, a second electrode and an ionization device to selectively ionize molecules in an electric field between the first and second electrodes. The ionized molecules can drive airflow between the first and second electrodes. In certain embodiments, the ionization device has an operational characteristic that prevents ionization of oxygen so that the airflow is ozone-free.

19 Claims, 2 Drawing Sheets

US 8,063,382 B2

OZONE-FREE IONIC WIND

BACKGROUND

1. Technical Field

Embodiments of the invention generally relate to air movers. In particular, embodiments are related to the creation of ozone-free ionic wind.

2. Discussion

Current ion generators may involve creating a very strong electric field with a sharp electrode tip (e.g., point electrode). This field can be capable of ionizing any nearby molecule in the air, including oxygen. Ozone may be produced, however, by the reaction of an oxygen molecule with an oxygen ion (or two oxygen ions). While some approaches to reducing ozone at the exhaust of the ion generator may involve minimizing ion production (which can reduce performance) or ozone sequestration/destruction, there still remains considerable room for improvement.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may provide for a computing system having a cooling apparatus with an upstream electrode, a ground electrode and an ionization device to selectively ionize molecules in an electric field between the surface and ground electrodes. The ionized molecules may drive ozone-free airflow between the upstream and ground electrodes, wherein the electric field is insufficiently intense to generate ions. In addition, the ionization device may have an operational characteristic that prevents ionization of oxygen. The computing system can also include an a heat sink that is exposed to a path of the ozone-free airflow, an integrated circuit coupled to the heat sink, and a mass storage device coupled to the integrated circuit.

Embodiments may also provide for an air mover having a first electrode, a second electrode and an ionization device to selectively ionized molecules in an electric field between the first and second electrodes. The ionized molecules can drive airflow between the first and second electrodes. By selectively ionizing molecules other than oxygen, ozone formation may be eliminated.

Embodiments can also provide for a method of cooling a heat source in which molecules in an electric field between a plurality of electrodes are selectively ionized. The ionized molecules can drive ozone-free airflow between the pair of electrodes. The method may also provide for exposing a heat source to the ozone-free airflow.

Figure 1:
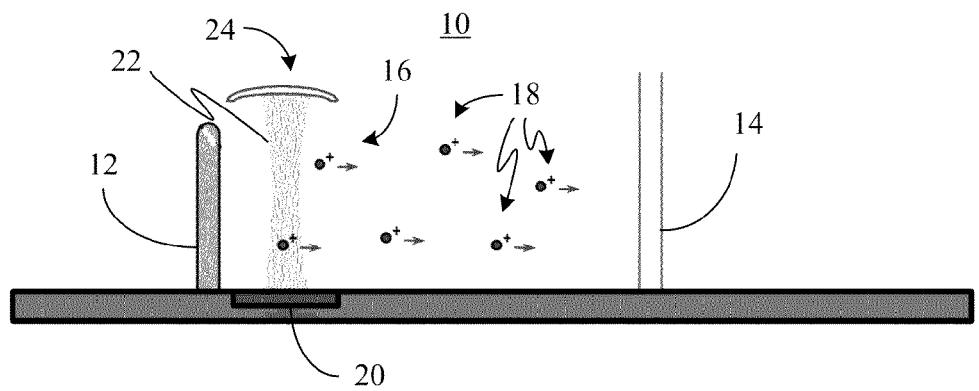
FIG. 1 is a side view of an example of an air mover according to an embodiment.

FIG. 1 shows an air mover 10 having a high voltage upstream electrode 12, an electrode with a lower potential such as a ground electrode 14 and an ionization device 16. The illustrated high voltage upstream electrode 12 has a potential gap with the ground electrode 14 that creates an electric field, but the electric field is insufficiently intense to generate ions (e.g., electrode is not a sharp/point electrode that may focus the electric field to a very high intensity to create a corona or plasma discharge). Generally, the ionization device 16 can selectively ionize molecules in the electric field between the electrode 12 and ground electrode 14, wherein the ionized molecules 18 may drive airflow from the electrode 12 towards the ground electrode 14. In particular, the ionization device 16 can have an operational characteristic that prevents the ionization of oxygen. Accordingly, the interaction between the illustrated ionized molecules 18 and the surrounding air will result in ozone-free airflow.

In the particular example shown, the ionization device 16 includes a laser 20 such as a diode laser, and the operational characteristic includes a wavelength that is tuned to a single or multiple photon absorption frequency of a particular molecule, such as water (e.g., moisture), carbon dioxide, or nitrogen. The spectroscopic properties (e.g., photon absorption frequencies) for these species are well documented. Thus, when the laser 20 directs photons 22 having the desired wavelength into the electric field, the selectively ionized molecules 18 can be generated. If necessary, the surrounding environment can be enriched with the target molecule using an appropriate dispensing device such as a humidifier (e.g., if water is targeted) or a nitrogen dispenser.

In addition, a number of well-documented optical techniques may be used to achieve the illustrated ionization. For example, laser absorption processes could provide for absorption of one or more photons 22 by the targeted molecule, wherein the molecule eventually becomes so excited that it loses an electron (e.g., single- or multi-photon absorption). The laser absorption processes could include any combination of photon absorption, other resonant techniques (e.g., Resonance Enhanced Multiphoton Ionization or REMPI), and non-resonant techniques (e.g., Multiphoton Ionization or MPI). In addition, collisionally enhanced approaches (e.g., Collisionally Induced Ionization) may provide for ion formation via a collision of a target molecule that has been excited by a laser absorption process with another molecule. As will be discussed in greater detail below, other non-laser-based approaches such as radioactive bombarding could also use this technique.

The laser-based ionization device 16 may also include an optical cavity 24 disposed within the electric field and in the photon path of the laser 20, wherein the optical cavity 24 can have one or more reflectors to concentrate the photons 22 from the laser 20. Such an approach can increase the intensity of the photon concentration by orders of magnitude and further improve the efficiency of the overall process. In addition, the optical cavity 24 may enable the use of a smaller and/or lower intensity laser 20. Such an advantage may be particularly beneficial in cost-sensitive applications, or low profile/small form factor environments such as mobile computing environments. The illustrated air mover 10 can therefore provide a unique ozone-free solution that is useful in surface cooling applications as well as bulk air moving applications such as mobile computing platform cooling or air cleaning systems.

Figure 2A:
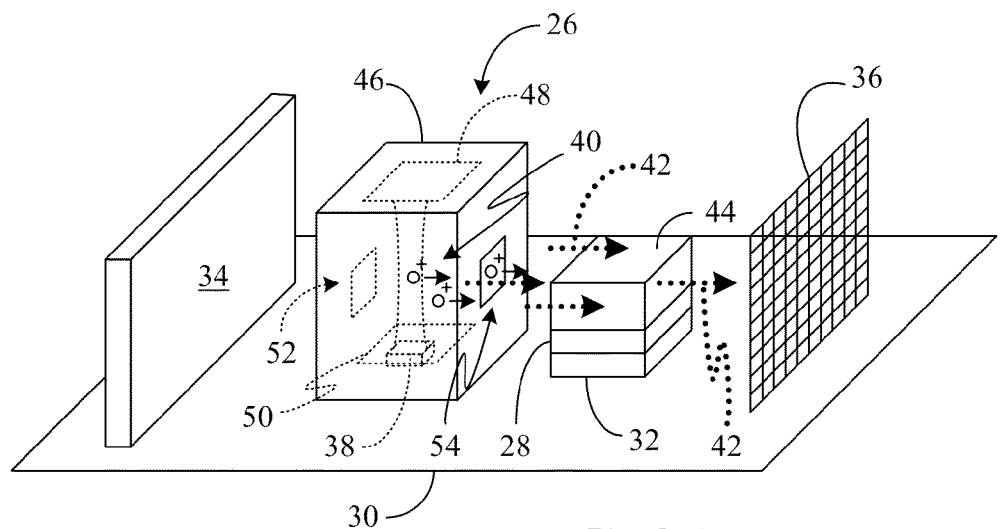
FIG. 2A is a perspective view of an example of a laser-based cooling apparatus according to an embodiment.

Turning now to FIG. 2A, a surface cooling application is shown in which a laser-based cooling apparatus 26 is used to provide a heat transfer enhancement to an integrated circuit (IC) 28 such as a processor that is mounted to a circuit board such as a motherboard 30 via a socket 32. The motherboard 30 could be part of a mobile computing system such as a server, desktop personal computer (PC), notebook, personal digital assistant/PDA, wireless smart phone, media player, imaging system, etc. While the illustrated cooling apparatus 26 is mounted on the motherboard 30 beside the IC 28, the cooling apparatus 26 could also be mounted flush with the surface to be cooled (e.g., on top of a CPU package), to enhance the surface cooling effect.

In the illustrated example, the ionization device 26 includes an upstream electrode 34, a ground screen that functions as a ground electrode 36, and a laser 38 that selectively ionizes molecules in an electric field between the electrodes 34, 36. As already noted, the upstream electrode 34 could be a high voltage electrode, wherein the electric field is insufficiently intense to generate ions. In addition, although the upstream electrode 34 is shown as a surface electrode, the upstream electrode 34 may also have a wire, screen or point configuration. Indeed, the upstream electrode 34 may be configured as a plurality of electrodes. For example, the upstream electrode 34 might include one high voltage electrode as well as a series of electrodes with decreasing voltages so that the electric field extends across multiple electrodes and the ions may be accelerated along the entire "ladder" configuration.

The selectively ionized molecules 40 can drive ozone-free airflow 42 between the electrodes 34, 36 because the illustrated laser 38 has an operational characteristic that prevents ionization of oxygen. The illustrated IC 28 is coupled to a heat sink 44 that is exposed to the path of the ozone-free airflow 42. Other heat sources, or high temperature components such as heat pipes, heat exchangers, chassis skins, chassis enclosure surfaces, memory, etc., could be substituted for the IC 28 and/or heat sink 44.

As already noted, the operational characteristic that prevents ionization of oxygen could be a wavelength that is tuned to a photon absorption frequency of a particular molecule, such as water, carbon dioxide, or nitrogen. The cooling system 26 may also include an optical cavity 46 that has a plurality of reflectors 48, 50 to concentrate the photons from the laser 38, as well as crosswise openings 52, 54 to permit airflow through the optical cavity 46.

Figure 2B:
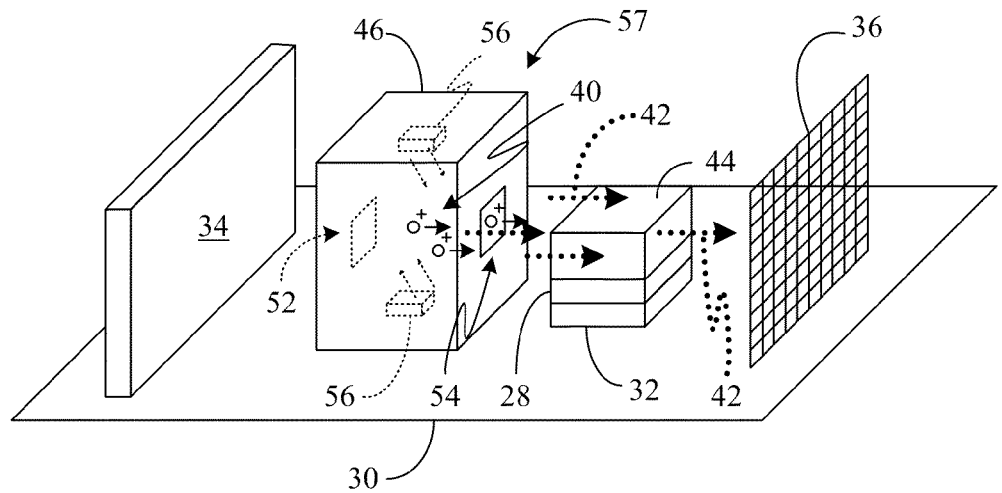
FIG. 2B is a perspective view of an example of a radioactive material-based cooling apparatus according to an embodiment.

FIG. 2B demonstrates a cooling apparatus 57 in which the ionization device alternatively includes a radioactive material 56 such as americium, wherein the operational characteristic that prevents ionization of oxygen is an energy level associated with emitted particles and target molecules. In particular, the radioactive material 56 might direct radioactive particles (e.g., alpha, beta particles) into the electric field, where the particles have an energy that is at or higher than the resonant energy of the targeted molecule. Thus, the collision between the radioactive particles and the targeted molecules may place the electrons of the targeted molecules in an allowed (e.g., resonant) and/or temporary (non-resonant) energy state and ultimately ionize the molecule. The resulting ionized molecules 40 can drive ozone-free airflow 42 between the electrodes 34, 36.

Figure 3:
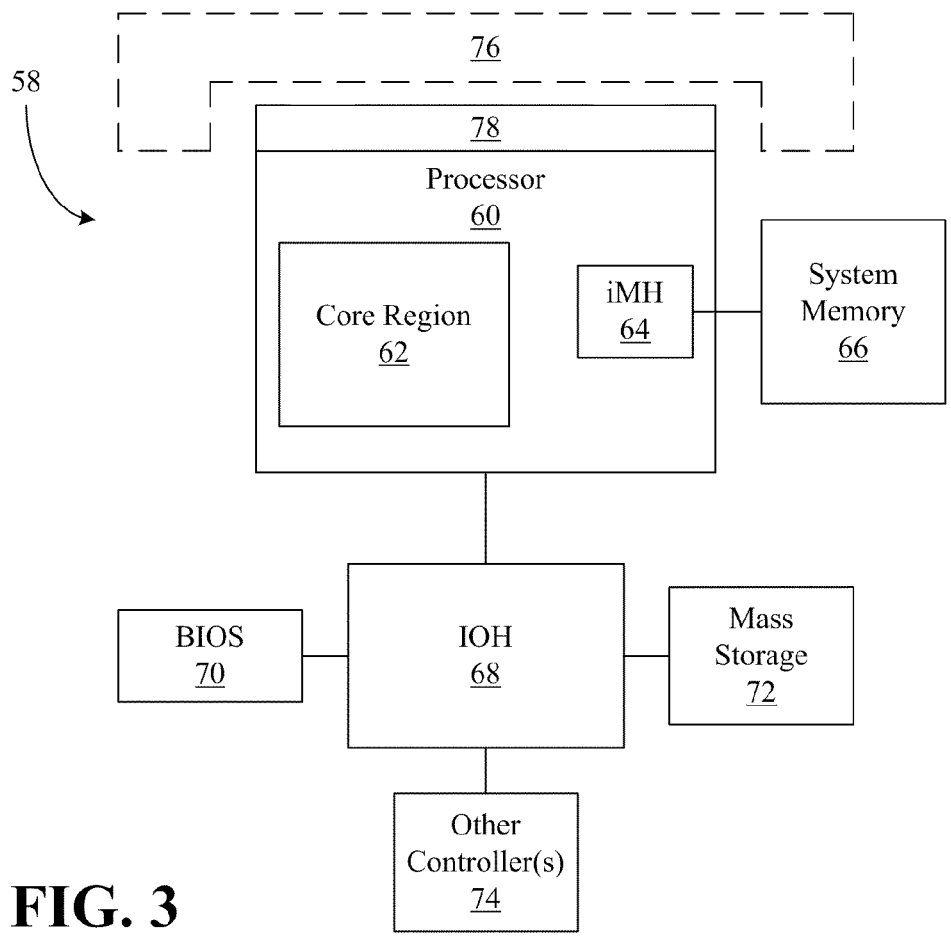
FIG. 3 is a block diagram of an example of a computing system with a cooling apparatus according to an embodiment.

FIG. 3 shows a computing system 58 having a processor 60 with a core region 62 and an integrated memory hub (iMH) 64 that controls access to system memory 66. The system memory 66 might include dual data rate (DDR) synchronous dynamic random access dynamic random access memory (SDRAM, e.g., DDR3 SDRAM JEDEC Standard JESD79-3C, April 2008; DDR4) modules. The modules of the RAM may be incorporated into a single inline memory module (SIMM), dual inline memory module (DIMM), small outline DIMM (SODIMM), and so on. The illustrated computing system 58 also includes an I/O controller hub (IOH) 82, also known as a Southbridge, BIOS (basic input/output system) 70, mass storage 72, and various other controllers 74. Examples of the mass storage device 72 include, but are not limited to, a hard disk drive, a compact disk (CD) drive, a digital versatile disk (DVD) drive, a floppy diskette, a tape system, and so forth.

The computing system 58 may also include a cooling apparatus 76 such as the cooling apparatus 26 (FIG. 2A) or the cooling apparatus 57 (FIG. 2B), already discussed. Thus, the cooling apparatus 76 can provide for ozone-free airflow that may be directed to a heat sink 78 to which the processor 60 is attached. The airflow can therefore provide a surface cooling effect to the heat sink 78 and processor 60 due to convective heat transfer.

Figure 4:
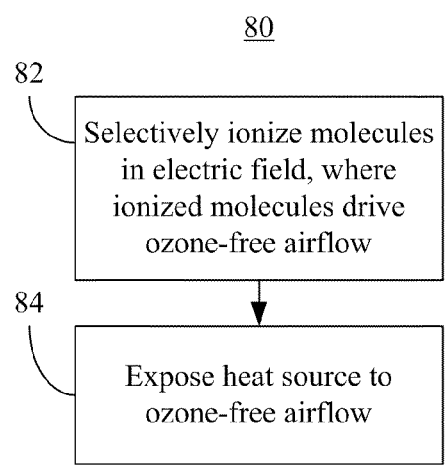
FIG. 4 is a flowchart of an example of a method of cooling a heat source according to an embodiment.

Turning now to FIG. 4, a method 80 of cooling a heat source is shown. The method 80 may be implemented mechanically, in fixed-functionality hardware, microcode, software, or any combination thereof. For example, mechanical implementations could involve the use of lasers and/or radioactive isotopes. Hardware implementations might involve the use of circuit technology such as application specific integrated circuit (ASIC), complementary metal oxide semiconductor (CMOS) or transistor-transistor logic (TTL) technology, or any combination or variation thereof. Processing block 82 provides for selectively ionizing molecules in an electric field between a plurality of electrodes, wherein the ionized molecules drive ozone-free airflow. As already noted, selectively ionizing molecules could include preventing ionization of oxygen. Block 84 provides for exposing a heat source to the ozone-free airflow.

Thus, the techniques described herein can provide for non-caustic and non-toxic wind that could be used in a wide variety of applications including, but not limited to, surface cooling and bulk air flow. Certain approaches may also employ an optical cavity to improve efficiency as well as reduce the intensity requirements of a laser-based solution. Moreover, ion production need not be minimized, which can lead to more aggressive and powerful wind generation. In addition, complex and potentially expensive ozone sequestration and/or destruction techniques can be eliminated to further enhance the overall attractiveness of the system.

Embodiments of the present invention are applicable for use with all types of computing systems and semiconductor integrated circuit ("IC") chips. Examples of these IC chips include but are not limited to processors, controllers, chipset components, programmable logic arrays (PLA), memory chips, network chips, and the like. In addition, in some of the drawings, airflow and/or signal conductor lines may be represented with lines. Some may be thicker, to indicate more constituent signal paths, have a number label, to indicate a number of constituent signal paths, and/or have arrows at one or more ends, to indicate primary information or flow direction. This, however, should not be construed in a limiting manner. Rather, such added detail may be used in connection with one or more exemplary embodiments to facilitate easier understanding of a circuit. Any represented signal or airflow lines, whether or not having additional information, may actually comprise one or more signals that may travel in multiple directions and may be implemented with any suitable type of cooling or signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known mechanical and/or power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" is used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A computing system comprising:
   a cooling apparatus including an upstream electrode, a ground electrode and an ionization device to selectively ionize molecules in an electric field between the upstream and ground electrodes, the ionized molecules to drive ozone-free airflow between the upstream and ground electrodes, wherein the electric field is insufficiently intense to generate ions and the ionization device has an operational characteristic to prevent ionization of oxygen;
   a heat sink that is exposed to a path of the ozone-free airflow; and
   an integrated circuit coupled to the heat sink.

2. The computing system of claim 1, wherein the ionization device includes a laser and the operational characteristic includes a wavelength corresponding to a photon absorption frequency of a particular molecule, the laser to direct photons having the wavelength into the electric field.

3. The computing system of claim 2, wherein the particular molecule includes at least one of water, carbon dioxide and nitrogen.

4. The computing system of claim 2, further including an optical cavity to be disposed within the electrical field and in a photon path of the laser, the optical cavity having a plurality of reflectors to concentrate photons from the laser and surfaces defining a crosswise opening to permit airflow through the optical cavity.

5. The computing system of claim 1, wherein the ionization device includes a radioactive material and the operational characteristic includes a resonant energy level of a particular molecule, the radioactive material to direct radioactive particles having the resonant energy level into the electric field.

6. The computing system of claim 5, wherein the particular molecule includes at least one of water, carbon dioxide and nitrogen.

7. An air mover comprising:
   a first electrode;
   a second electrode; and
   an ionization device to selectively ionize molecules in an electric field between the first and second electrodes, the ionized molecules to drive airflow between the first and second wherein the airflow is ozone-free airflow.

8. The air mover of claim 7, wherein the ionization device has an operational characteristic that prevents ionization of oxygen.

9. The air mover of claim 8, wherein the ionization device includes a laser and the operational characteristic includes a wavelength corresponding to a photon absorption frequency of a particular molecule, the laser to direct photons having the wavelength into the electric field.

10. The air mover of claim 9, wherein the particular molecule includes at least one of water, carbon dioxide and nitrogen.

11. The air mover of claim 9, further including an optical cavity to be disposed within the electric field and in a photon path of the laser, the optical cavity having a plurality of reflectors to concentrate photons from the laser and surfaces defining a crosswise opening to permit airflow through the optical cavity.

12. The air mover of claim 8, wherein the ionization device includes a radioactive material and the operational characteristic includes an energy level associated with a particular molecule, the radioactive material to direct radioactive particles having the energy level into the electric field.

13. They air mover of claim 12, wherein the energy level includes a resonant energy level of the particular molecule.

14. The air mover of claim 12, wherein the particular molecule includes at least one of water, carbon dioxide and nitrogen.

15. The air mover of claim 7, wherein at least one of the first and second electrodes is an upstream electrode and the electric field is insufficiently intense to generate ions.

16. A method comprising:
   selectively ionizing molecules in an electric field between a plurality of electrodes, the ionized molecules driving ozone-free airflow between the plurality of electrodes; and
   exposing a heat source to the ozone-free airflow.

17. The method of claim 16, wherein the electric field is insufficiently intense to generate ions and selectively ionizing molecules in the electric field includes preventing ionization of oxygen.

18. The method of claim 17, wherein preventing ionization of oxygen includes directing photons into the electric field, wherein the photons have a wavelength that is tuned to a photon absorption frequency of a non-oxygen molecule.

19. The method of claim 17, wherein preventing ionization of oxygen includes directing radioactive particles into the electric field, wherein the radioactive particles have an energy level that is associated with a non-oxygen molecule.

* * * * *

UNITED STATES PATENT AND TRADEMARK OFFICE
CERTIFICATE OF CORRECTION

| | |
|---|---|
| PATENT NO. | : 8,063,382 B2 |
| APPLICATION NO. | : 12/641753 |
| DATED | : November 22, 2011 |
| INVENTOR(S) | : Mark MacDonald et al. |

It is certified that error appears in the above-identified patent and that said Letters Patent is hereby corrected as shown below:

In column 6, line 37, in claim 13, delete "They air" and insert -- The air --, therefor.

Signed and Sealed this
Thirteenth Day of March, 2012

David J. Kappos
*Director of the United States Patent and Trademark Office*